(12) United States Patent
Koike et al.

(10) Patent No.: US 6,790,279 B2
(45) Date of Patent: Sep. 14, 2004

(54) METHOD FOR MANUFACTURING GROUP III NITRIDE COMPOUND SEMICONDUCTOR AND A LIGHT-EMITTING DEVICE USING GROUP III NITRIDE COMPOUND SEMICONDUCTOR

(75) Inventors: Masayoshi Koike, Aichi-ken (JP); Seiji Nagai, Aichi-ken (JP)

(73) Assignee: Toyoda Gosei Co., Ltd., Aichi (JP)

( * ) Notice: Subject to any disclaimer, the term of this patent is extended or adjusted under 35 U.S.C. 154(b) by 66 days.

(21) Appl. No.: 10/187,943

(22) Filed: Jul. 2, 2002

(65) Prior Publication Data

US 2002/0179005 A1 Dec. 5, 2002

Related U.S. Application Data

(62) Division of application No. 09/566,917, filed on May 9, 2000, now Pat. No. 6,436,188.

(30) Foreign Application Priority Data

May 10, 1999 (JP) ............................................. 11-129322

(51) Int. Cl.[7] ............................................. C30B 25/02
(52) U.S. Cl. ............................ 117/96; 117/95; 117/94; 117/105; 117/106; 117/952
(58) Field of Search ............................... 117/94, 95, 96, 117/105, 106, 952

(56) References Cited

U.S. PATENT DOCUMENTS 6,121,121 A    9/2000   Koide

FOREIGN PATENT DOCUMENTS

| EP | 551 721 | 7/1993 |
|---|---|---|
| EP | 951 055 | 10/1999 |
| JP | H 5-343741 | 12/1993 |
| JP | 11-043398 | 2/1999 |
| JP | 11-135770 | 5/1999 |
| JP | 11-135832 | 5/1999 |
| JP | H11-19167 | 7/1999 |
| JP | H11-191533 | 7/1999 |
| JP | H11-191659 | 7/1999 |
| JP | 11-251632 | 9/1999 |
| JP | 11-260737 | 9/1999 |
| JP | 11-274082 | 10/1999 |
| JP | 2000-174393 | 6/2000 |
| WO | WO 97/11518 | 3/1997 |
| WO | WO 98/47170 | 10/1998 |
| WO | WO 00/04615 | 1/2000 |

OTHER PUBLICATIONS

U.S. patent application Ser. No. 09/725,495, Umezaki, filed Nov. 30, 2000.

U.S. patent application Ser. No. 09/633,854, Koide, filed Aug. 7, 2000.

U.S. patent application Ser. No. 09/573,701, Koide et al., filed may 19, 2000.

(List continued on next page.)

*Primary Examiner*—Robert Kunemund
(74) *Attorney, Agent, or Firm*—McGinn & Gibb, PLLC

(57) ABSTRACT

A buffer layer 2 made of aluminum nitride (AlN) is formed on a substrate 1 and is formed into an island pattern such as a dot pattern, a striped pattern, or a grid pattern such that substrate-exposed portions are formed in a scattered manner. A group III nitride compound semiconductor 3 grows epitaxially on the buffer layer 2 in a longitudinal direction, and grows epitaxially on the substrate-exposed portions in a lateral direction. As a result, a group III nitride compound semiconductor 3 which has little or no feedthrough dislocations 4 is obtained. Because the region where the group III nitride compound semiconductor 3 grows epitaxially in a lateral direction, on region 32, has excellent crystallinity, forming a group III nitride compound semiconductor device on the upper surface of the region results in improved device characteristics.

18 Claims, 6 Drawing Sheets

OTHER PUBLICATIONS

Akasaki et al., "Effects on AlN Buffer Layer on Crystallographic Structure and on Electrical and Optical Properties of GAN and GaN–XALXn (0x0.4) Films Grown on Sapphire Substrate by MOVPE." Houranl of Crystal Growth, vol. 98, No. 1/02, Nov. 1, 1989, pp. 209–219.

Hiramatsu et al., "Selective area growth and epitaxial laterial overgrowth on GaN by metalorganic vapor phase epitaxy and hyride vapor phase epitaxy," Materials Science and Engineering b. CH. Elsevier Sequoia Lausanne. vol. 59, No. 1–3, May 6, 1999, pp. 104–111.

METHOD FOR MANUFACTURING GROUP III NITRIDE COMPOUND SEMICONDUCTOR AND A LIGHT-EMITTING DEVICE USING GROUP III NITRIDE COMPOUND SEMICONDUCTOR

This application is a divisional of Ser. No. 09/566,917 filed May 9, 2000 now U.S. Pat. No. 6,436,188.

BACKGROUND OF THE INVENTION

1. Field of the Invention

The present invention relates to a method for manufacturing a group III nitride compound semiconductor. Especially, the present invention relates to a method for manufacturing a group III nitride compound semiconductor in which an epitaxial lateral overgrowth (ELO) method is used to form a layer on a substrate. The present invention also relates to a light-emitting device using a group III nitride compound semiconductor formed on a group III nitride compound semiconductor layer using the ELO method. A group III nitride compound semiconductor can be made of binary compounds such as AlN, GaN or InN, ternary compounds such as $Al_xGa_{1-x}N$, $Al_xIn_{1-x}N$ or $Ga_xIn_{1-x}N$ ($0<x<1$), or quaternary compounds $Al_xGa_yIn_{1-x-y}N$ ($0<x<1$, $0<y<1$, $0<x+y<1$), that is, those are represented by a general formula $Al_xGa_yIn_{1-x-y}N$ ($0 \leq x \leq 1$, $0 \leq y \leq 1$, $0 \leq x+y \leq 1$).

2. Description of the Related Art

A group III nitride compound semiconductor is a direct-transition-type semiconductor having a wide emission spectrum range from ultraviolet to red, and is applied to light-emitting devices such as light-emitting diodes (LEDs) and laser diodes (LDs). The group III nitride compound semiconductor is, in general, formed on a sapphire substrate.

However, in the above-described conventional technique, when a layer of a group III nitride compound semiconductor is formed on a sapphire substrate, cracks and/or warpage are generated in the semiconductor layer due to a difference in thermal expansion coefficient between sapphire and the group III nitride compound semiconductor, and dislocations are generated in the semiconductor layer due to misfit, which result in degraded device characteristics. Especially, dislocations due to misfit are feedthrough dislocations which penetrate the semiconductor layer in longitudinal direction, resulting in propagation of about $10^9$ cm$^{-2}$ of dislocation in the group III nitride compound semiconductor.

FIG. 6 illustrates a schematic view showing a structure of a conventional group III nitride compound semiconductor. In FIG. 6, a buffer layer 2 and a group III nitride compound semiconductor layer 3 are formed successively on a substrate 1. In general, the substrate 1 and the buffer layer 2 are made of sapphire and aluminum nitride (AlN), respectively. Although the AlN buffer layer 2 is formed to relax misfit between the sapphire substrate 1 and the group III nitride compound semiconductor layer 3, possibility of generating dislocations cannot be 0. Feedthrough dislocations 4 are propagated from dislocation generating points 40 in longitudinal direction (a direction vertical to a surface of the substrate), penetrating the buffer layer 2 and the group III nitride compound semiconductor layer 3. Thus, manufacturing a semiconductor device by laminating various group III nitride compound semiconductor layers on the group III nitride compound semiconductor layer 3 results in propagating feedthrough dislocations 4 from dislocation generating points 41 which reach the surface of the group III nitride compound semiconductor layer 3, further through the semiconductor device in longitudinal direction. Accordingly, it had been difficult to prevent dislocations from propagating in the semiconductor device at the time when a group III nitride compound semiconductor layer is formed.

SUMMARY OF THE INVENTION

Accordingly, in light of the above problems, an object of the present invention is to realize an efficient method capable of forming a layer of a group III nitride compound semiconductor without generation of cracks and dislocations to thereby improve device characteristics.

In order to solve the above problems, the present invention has a first feature that resides in a method for manufacturing a group III nitride compound semiconductor, which hardly grows epitaxially on a substrate, by crystal growth, comprising: forming a buffer layer on a substrate into an island pattern such as a dot pattern, a striped pattern, or a grid pattern such that substrate-exposed portions are formed in a scattered manner; and forming a group III nitride compound semiconductor layer on the buffer layer by growing a group III nitride compound epitaxially in longitudinal and lateral directions.

Here forming substrate-exposed portions in a scattered manner does not necessarily represent the condition that each substrate-exposed portions is completely separated, but represents the condition that the buffer layer exists around arbitrary substrate-exposed portions. In order to form the buffer layer into an island pattern such as a dot pattern, a striped pattern or a grid pattern, the following method can be applied: forming the buffer layer on the entire surface of the substrate and then removing the desired portions of the buffer layer by etching; or forming a selective mask such as an $SiO_2$ film on the substrate and partially forming the buffer layer.

The "lateral" direction as used in the specification refers to a direction parallel to a surface of the substrate. By using the above-described method, the group III nitride compound semiconductor grows on the buffer layer in a longitudinal direction. The group III nitride compound semiconductor which grows on the buffer layer in a longitudinal direction also grows in a lateral direction in order to cover the substrate-exposed portions. The growth velocity of the group III nitride compound semiconductor in the longitudinal and lateral directions can be controlled by conditions of, for example, temperature, pressure, or supplying conditions of source materials. Accordingly, a group III nitride compound semiconductor layer reunited into one layer can cover the substrate-exposed portions which are not covered by the buffer layer from a base of the buffer layer which is formed into an island pattern such as a dot pattern, a striped pattern or a grid pattern. As a result, feedthrough dislocations of the group III nitride compound semiconductor exists only in the regions of group III nitride compound semiconductor layer formed on the buffer layer, which is formed into an island pattern such as a dot pattern, a striped pattern or a grid pattern. This is because feedthrough dislocations are not generated when the group III nitride compound semiconductor grows in a lateral direction but are generated when it grows in a longitudinal direction. Accordingly, surface density of longitudinal feedthrough dislocations of the group III nitride compound semiconductor layer decreases, and crystallinity of the device is improved. When a group III nitride compound semiconductor device which is manufactured using only a group III nitride compound semiconductor layer which is formed on the substrate-exposed portions, or the regions which are not covered by a buffer layer, surface density of feedthrough dislocations of the device can become 0.

The second feature of the present invention is a method for manufacturing a group III nitride compound semiconductor, which hardly grows epitaxially on a substrate, by crystal growth, comprising: forming a buffer layer on a substrate into an island pattern such as a dot pattern, a striped pattern, or a grid pattern such that substrate-exposed portions are formed in a scattered manner; forming a group III nitride compound semiconductor layer on the buffer layer by growing a group III nitride compound epitaxially in longitudinal and lateral directions; etching at least one of the regions of the group III nitride compound semiconductor layer, growing in a longitudinal direction on the buffer layer which is formed into an island pattern; and growing the group III nitride compound semiconductor, which is left without being etched, in a lateral direction. Forming substrate-exposed portions in a scattered manner is explained in the first feature.

In the second feature of the present invention, the group III nitride compound semiconductor layer is etched after carrying out the method of the first feature, and then it is grown in a lateral direction in order to cover the etched regions. As described in the first feature of the present invention, the surface density of longitudinal feedthrough dislocations of the group III nitride compound semiconductor layer decreases, and crystallinity of the device is thus improved. By etching the regions of the group III nitride compound semiconductor layer which grow on the buffer layer in a longitudinal direction and have feedthrough dislocations, feedthrough dislocations generated by the longitudinal growth of the semiconductor layer can be eliminated. It is preferable to also etch the buffer layer to expose the substrate during etching of the group III nitride compound semiconductor layer.

By growing the group III nitride compound semiconductor in a lateral direction again, the substrate-exposed regions can be covered and a group III nitride compound semiconductor layer which is reunited into one layer can be obtained. The lateral growth can be promoted by the conditions of, for example, temperature, pressure, or supplying conditions of source materials. As a result, feedthrough dislocations existing in the group III nitride compound semiconductor layer can be eliminated. Thus, the group III nitride compound semiconductor layer does not have longitudinal feedthrough dislocations, and crystallinity of the device is, therefore, improved. The scope of the present invention also involves a method of etching regions of the group III nitride compound semiconductor layer, including the upper surface of the buffer layer, wider than the width of the buffer layer in case that feedthrough dislocations are generated partially inclined (in a lateral direction). Similarly, all the regions of the group III nitride compound semiconductor layer which have feedthrough dislocations and grow on the buffer layer, which is formed into an island pattern such as a dot pattern, a striped pattern, or a grid pattern, is not necessarily etched. The group III nitride compound semiconductor layer can be reunited into one layer by growing it in a lateral direction again, even when feedthrough dislocations are left without being etched in the semiconductor layer. The scope of the present invention also involves a method of dividing etching and epitaxial lateral overgrowth (ELO) components into several parts, according to a position or a design of the regions to form the buffer layer and limitations in the process afterward.

The third feature of the present invention is to combine epitaxial growth of a group III nitride compound semiconductor layer formed on the buffer layer in longitudinal direction and epitaxial growth of the group III nitride compound in a lateral direction by using the difference between the velocities of epitaxial growth of the group III nitride compound semiconductor layer on the buffer layer and on the exposed substrate, in order to obtain a group III nitride compound semiconductor layer which covers the surface of the substrate. The difference between the velocities of epitaxial growth of the group III nitride compound semiconductor on the buffer layer and on the substrate can be easily controlled by the conditions of, for example, temperature, pressure, or supplying conditions of source materials. Similarly, the velocities of growing the group III nitride compound semiconductor epitaxially on the buffer layer in longitudinal and lateral directions can be controlled. By controlling these conditions, surface density of feedthrough dislocations of the group III nitride compound semiconductor layer in longitudinal direction is decreased, and crystallinity of the device is improved.

In this feature, the difference between the velocities of epitaxial growth of the group III nitride compound semiconductor on the buffer layer and on the substrate is used. But this does not necessarily exclude the possibility that the group III nitride compound semiconductor comprises a compound which is identical to that of the buffer layer in view of stoichiometric composition. Depending on the layer formed under the semiconductor layer and the condition of the epitaxial growth, the compound of the group III nitride compound semiconductor can be non-crystalline, a set of micro-crystalline and polycrystalline, or single-crystalline. The difference between the velocities of epitaxial growth of the group III nitride compound semiconductor layer on the buffer layer and on the exposed substrate is an essential point of the present invention, and combination of the group III nitride compound, the compound forming the buffer layer, and materials to form the substrate is a method of generating the different epitaxial growth velocities.

The fourth feature of the present invention is that the substrate is made of sapphire. As a result, it is difficult to epitaxially grow the group III nitride compound semiconductor on the substrate.

The fifth feature of the present invention is that the buffer layer is made of aluminum nitride (AlN). And the sixth feature of the present invention is that the group III nitride compound semiconductor which grows in lateral direction does not comprise aluminum (Al).

The seventh feature of the present invention is to obtain a light-emitting group III nitride compound semiconductor device by forming an another group III nitride compound semiconductor layer on the group III nitride compound semiconductor, which is formed on the region where the buffer layer is not formed, by using the above-described method. Because the group III nitride compound semiconductor layer is laminated on the regions which have no surface density of longitudinal feedthrough dislocations, reliability of the device is improved.

The eighth feature of the present invention is to obtain only the group III nitride compound semiconductor layer by using the above-described method. The group III nitride compound semiconductor layer, which is a layer laminated on the substrate, is left by removing the substrate. If necessary, the buffer layer can be removed with the substrate. When an insulator is used to form the substrate, the group III nitride compound semiconductor layer can dope an arbitrary dopant into the substrate so that the substrate has an arbitrary resistivity, and the group III nitride compound semiconductor layer with non-insulated substrate can be obtained. Because the group III nitride compound semiconductor layer has little or no surface density of feedthrough dislocations, it can be useful as a semiconductor substrate.

DETAILED DESCRIPTION OF THE PREFERRED EMBODIMENT

The present invention will now be described by way of concrete embodiments.

FIGS. 1A–1E, 3A–3C, and 4A–4C each show views of processes for manufacturing a group III nitride compound semiconductor according to the first embodiment of the present invention. The group III nitride compound semiconductor of the present invention is formed through the use of a metal organic vapor phase epitaxy (hereinafter referred to as "MOVPE") method. Gases used in the MOVPE method are ammonia ($NH_3$), carrier gas ($H_2$, or $N_2$), trimethyl gallium ($Ga(CH_3)_3$) (hereinafter referred to as "TMG"), and trimethyl aluminum ($Al(CH_3)_3$) (hereinafter referred to as "TMA").

(First Embodiment)

Figure 1A:
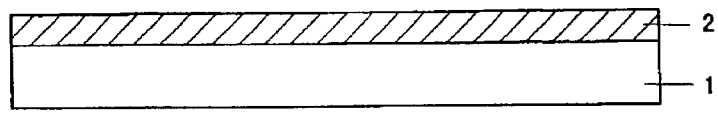
FIGS. 1A–1E are sectional views showing a method for manufacturing the group III nitride compound semiconductor according to a first embodiment of the present invention.
Figure 1B:
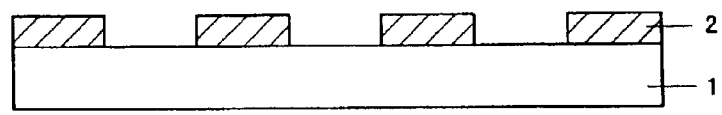
Figure 1C:
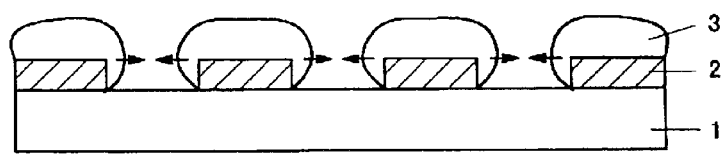
Figure 1D:
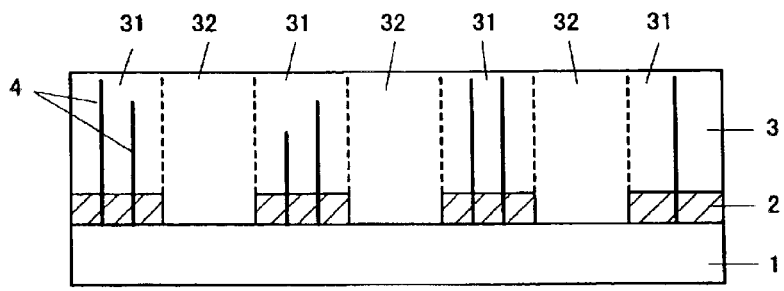
Figure 1E:
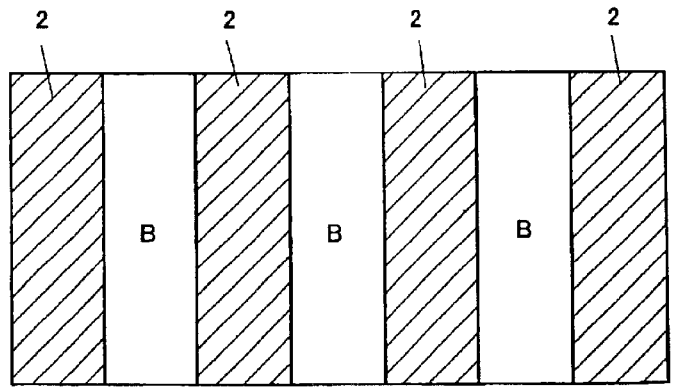

A single crystalline sapphire substrate 1 is formed to have a main surface 'a' which is cleaned by an organic washing solvent and heat treatment. An AlN buffer layer 2, having a thickness of about 40 nm, is then formed on the surface 'a' of the sapphire substrate 1 under conditions controlled by lowering the temperature to 400° C. and concurrently supplying $H_2$, $NH_3$ and TMA at a flow rate of 10L/min, 5L/min, and 20 μmol/min, respectively, for 3 minutes (FIG. 1A). The buffer layer 2 is then dry-etched in a striped pattern by selective dry-etching including reactive ion etching (RIE) using a hard baked resist mask. Accordingly, the AlN buffer layer 2 is formed in a striped pattern such that each region defined above the buffer layer 2, has a width of 5 μm, and each region where the sapphire substrate 1 was exposed, has a width of 5 μm, and are formed alternately (FIGS. 1B and 1E).

A GaN layer 3 having a thickness of several thousands Å was grown to cover the entire surface of the substrate and the AlN buffer layer, while maintaining the substrate 1 at a temperature of 1150° C., and feeding $H_2$, $NH_3$ and TMG at 20L/min, 10L/min and 5 μmol/min, respectively. TMG is then fed at 300 μmol/min, thereby obtaining about 3 μm in thickness of GaN layer 3 at a growth temperature of 1000° C. In this embodiment, the GaN layer 3 was formed by growing GaN regions 32 epitaxially on the sapphire substrate 1 in a lateral direction, from the GaN regions 31 which grows epitaxially on the upper surface of the AlN buffer layer 2 in a longitudinal direction and serves as a nucleus (FIGS. 1C and 1D). Accordingly, GaN regions 32 having excellent crystallinity can be obtained on the regions where the AlN buffer layer 2 is not formed and the sapphire substrate 1 is exposed.

Figure 2:
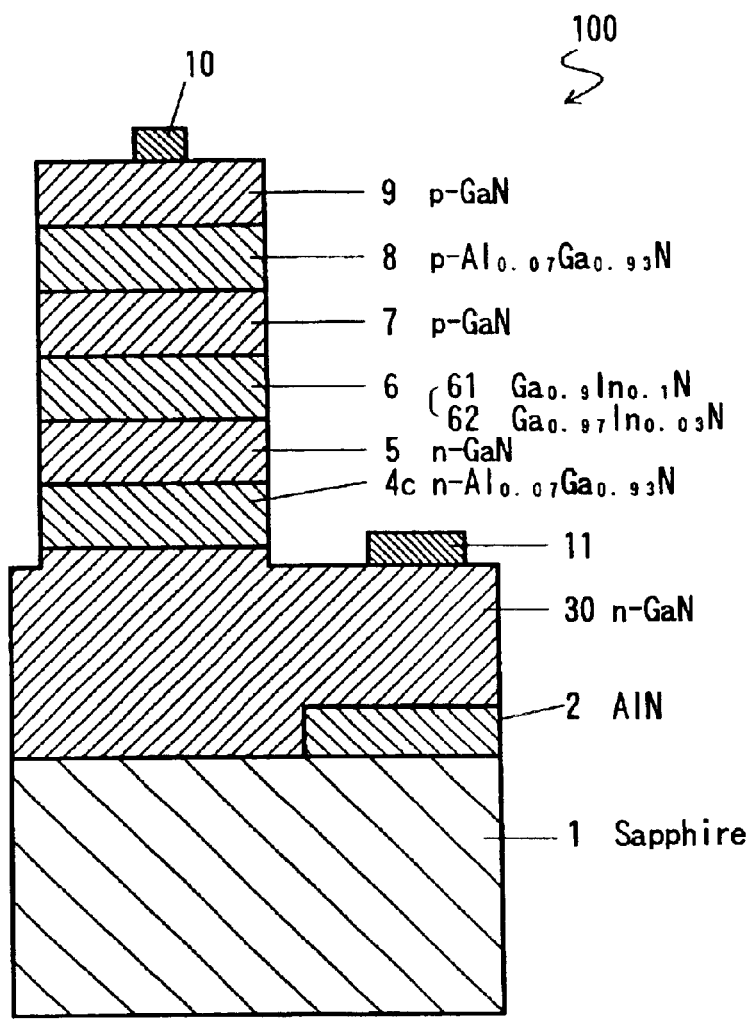
FIG. 2 is a sectional view showing a laser diode (LD) using the group III nitride compound semiconductor according to the first embodiment of the present invention.

A group III nitride compound semiconductor device can be formed using the GaN regions 32 having excellent crystallinity, which is formed by epitaxial lateral overgrowth (ELO) method on the upper surface of the sapphire substrate 1, where predetermined regions of the substrate 1 for forming the device are exposed. FIG. 2 illustrates a device 100 comprising an LD formed on the GaN regions of high crystallinity in a Si-doped n-type GaN layer 30. The n-GaN regions of high crystallinity is formed in the regions where the AlN buffer layer is not formed, and the following layers are laminated in sequence on each of the regions: an n-$Al_{0.07}Ga_{0.93}N$ cladding layer 4c; an n-GaN guide layer 5; an emission layer 6 having a multiple quantum well (MQW) structure, in which a well layer 61 made of $Ga_{0.9}In_{0.1}N$ and a barrier layer 62 made of $Ga_{0.97}In_{0.03}N$ were laminated alternately; a p-GaN guide layer 7; a p-$Al_{0.07}Ga_{0.93}N$ cladding layer 8; and a p-GaN contact layer 9. Then electrodes 11 and 10 are formed on the n-GaN layer 30 and the p-GaN contact layer 9, respectively. Because the LD shown in FIG. 2 does not have feedthrough dislocations except around the electrode 11, reliability of the LD as a device is improved.

(Second Embodiment)

A single crystalline sapphire substrate 1 is formed to have a main surface 'a' which is cleaned by an organic washing solvent and heat treatment. An AlN buffer layer 2, having a thickness of about 40 nm is then formed on the surface 'a' of the sapphire substrate 1 under conditions controlled by lowering the temperature to 400° C. and concurrently supplying $H_2$, $NH_3$ and TMA at a flow rate of 10L/min, 5L/min, and 20 μmol/min, respectively, for 3 minutes. The buffer layer 2 is dry-etched in a striped pattern by selective dry-etching including reactive ion etching (RIE) using a hard baked resist mask. Accordingly, the AlN buffer layer 2 is formed in a striped pattern such that each region defined above the buffer layer 2, has a width of 5 μm, and each region where the sapphire substrate 1 is exposed, has a width of 5 μm, and are formed alternately.

A GaN layer 3 having a thickness of several thousands Å is grown to cover the entire surface of the substrate and the AlN buffer layer, while maintaining the substrate 1 at a temperature of 1150° C., and feeding $H_2$, $NH_3$ and TMG were fed at 20L/min, 10L/min and 5 μmol/min, respectively. TMG is then fed at 300 μmol/min, thereby obtaining about 3 μm in thickness of GaN layer 3 at a growth temperature of 1000° C. In this embodiment, the GaN layer 3 is formed by growing GaN regions 32 epitaxially on the sapphire substrate 1 in a lateral direction, from the GaN regions 31 which grow epitaxially on the upper surface of the AlN buffer layer 2 in a longitudinal direction and serves as a nucleus (FIG. 3A).

Figure 3A:
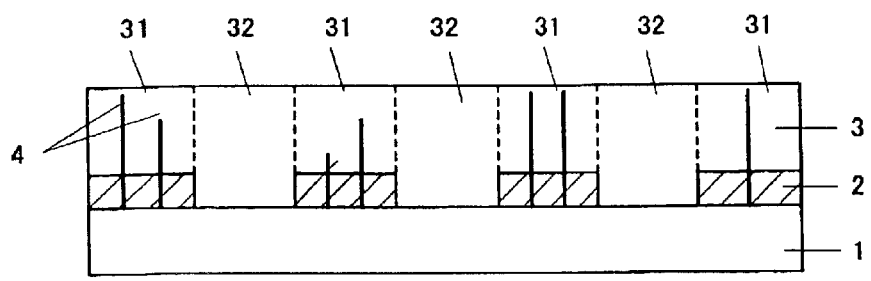
FIGS. 3A–3C are sectional views showing a method for manufacturing the group III nitride compound semiconductor according to a second embodiment of the present invention.
Figure 3B:
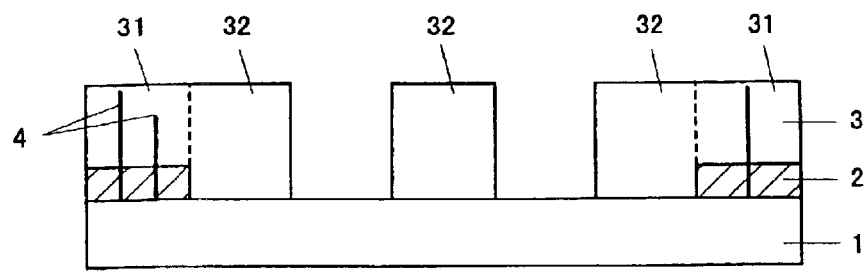

The GaN regions 31 which grow epitaxially on the upper surface of the AlN buffer layer 2 in a longitudinal direction is dry-etched by selective etching (FIG. 3B). In this embodiment, AlN buffer layer 2 is also etched. A film 3 having a thickness of several thousands Å is formed to cover the entire surface of the group III nitride compound semiconductor, while maintaining the substrate 1 at a temperature of 1150° C., and feeding $H_2$, $NH_3$ and TMG at 20L/min, 10L/min and 5 μmol/min, respectively. TMG is then fed at 300 μmol/min, thereby obtaining about 3 μm in thickness of GaN layer 3 at a growth temperature of 1000°

Figure 3C:
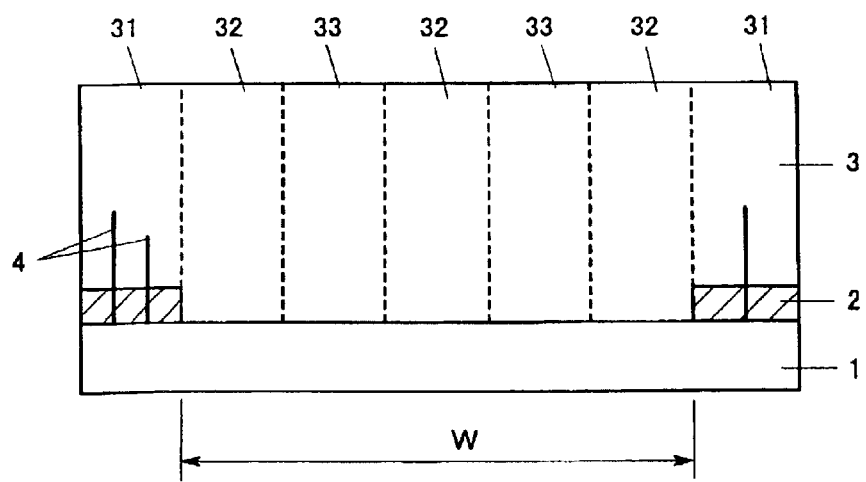

C. TMG is then fed to the device at 300 μmol/min, wherein each space where the GaN region 31 is removed is covered again by growing a region 33 in a lateral direction at a growth temperature of 1000° C., and the GaN layer 3 is obtained having a thickness about 3 μm (FIG. 3C). Accordingly, GaN region 32 and GaN region 33, both have high crystallinity, and are formed on the sapphire substrate 1. The GaN region 32 is formed on the sapphire substrate 1 which is exposed by dry-etching the AlN buffer layer 2. The GaN region 33 is formed on the sapphire substrate 1 which is exposed by dry-etching the GaN regions 31 and the AlN buffer layer 2. As a result, a GaN layer 3, which has excellent crystallinity and does not have feedthrough dislocations, can be formed over a wide area W as shown in FIG. 3C.

Figure 4A:
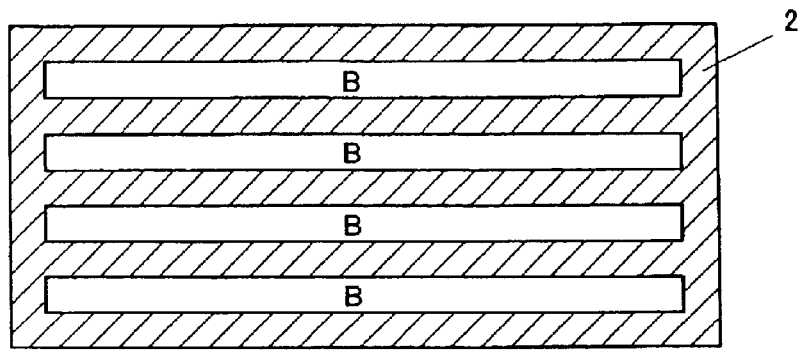
FIGS. 4A–4C are views showing the method for manufacturing the group III nitride compound semiconductor according to a second embodiment of the present invention.
Figure 4B:
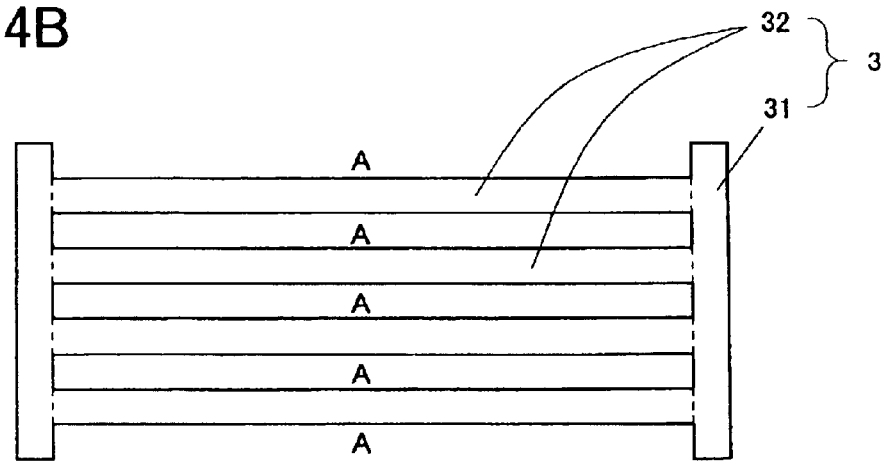
Figure 4C:
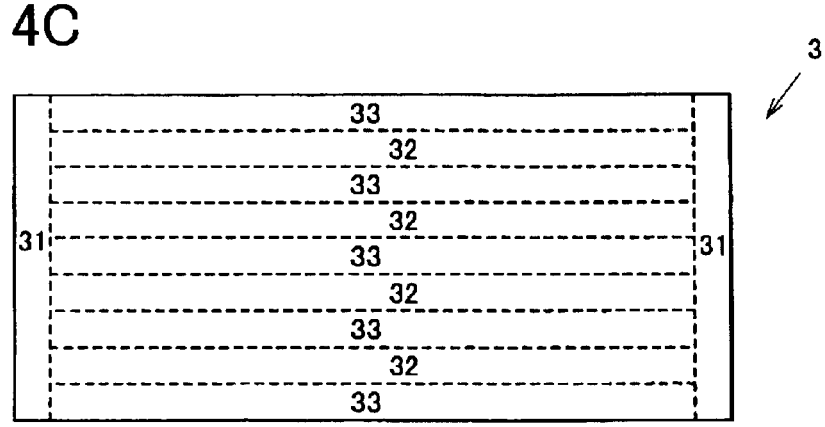

FIGS. 4A–4C are plan views of FIGS. 3A–3C. In this embodiment, a GaN layer of excellent crystallinity is formed on a region other than a portion where the GaN region 31, which grows epitaxially on the upper surface of the AlN buffer layer 2 in a longitudinal direction, are formed.

FIG. 4A illustrates the buffer layer 2 which is formed in a striped pattern. Regions represented by B are where the sapphire substrate 1 is exposed. FIG. 4B shows the GaN layer 3 left after etching the GaN region 31 and the buffer layer 2 thereunder, which grows epitaxially on the buffer layer 2 in a longitudinal direction. As shown in FIG. 4B, the GaN region 31 which has feedthrough dislocations is left at both sides of the substrate in order to support the GaN regions 32 of higher crystallinity, thus, preventing the GaN region 32 from peeling. FIG. 4C shows the GaN layer 3 reunited into one layer by epitaxial lateral overgrowth (ELO). As shown in FIG. 4C, the GaN layer 3 comprises GaN regions 31, 32 and 33. The GaN region 31 is formed on the buffer layer 2 and has feedthrough dislocations. The GaN region 32 is formed on the exposed substrate 1 and has no feedthrough dislocations. The GaN region 33 is formed after removing the buffer layer 2 and the GaN layer 31 and has no feedthrough dislocations. Accordingly, the crystallinity of GaN regions 32 and 33, or a region W, which has no feedthrough dislocations, is very desirable.

After the above-described process, the sapphire substrate 1 and the buffer layer 2 are removed by machinery polishing and then the GaN region 31 which has feedthrough dislocations and is at both side of the substrate is cut. As a result, a group III nitride compound semiconductor substrate of excellent crystallinity, comprising the GaN layer 3 which has no feedthrough dislocations, is obtained.

Although the width of the regions defined above the AlN buffer layer 2, which are formed in a striped pattern, is 5 μm, a preferred range for the width is from 1 μm to 10 μm. This is because when the width of the regions becomes larger than 10 μm, the probability of generating dislocations increases. When the width of the regions becomes smaller than 1 μm, obtaining a GaN layer 3 with wide area and high quality becomes difficult. Additionally, although a width b of the regions B where the substrate 1 is exposed has a width of about 5 μm, a preferred range for the width is from 1 μm to 10 μm. This is because when the width of the regions B becomes larger than 10 μm, a longer time is required for lateral growth, and when the width of the regions B becomes smaller than 1 μm, the crystallinity of the GaN region 32 becomes too small. Further, in view of the crystallinity of the n-layer 3 made of GaN, the ratio of the width a of the region which is defined above the AlN buffer layer 2 to the width b of the region B where the sapphire substrate 1 is exposed; i.e., a/b, preferably falls within the range of 1 to 10.

In the above embodiments, a preferred range for thickness of the n-layer 3 made of GaN is 50 μm to 100 μm, because the n-layer 3 can be formed without dislocations.

In the present embodiment, the buffer layer 2 and the group III nitride compound semiconductor layer 3 comprise aluminum nitride (AlN) and gallium nitride (GaN), respectively. Alternatively, these materials are not limited to AlN and GaN, respectively. An essential point of the present invention is to grow the group III nitride compound semiconductor, which does not grow epitaxially on the substrate, on the buffer layer epitaxially in a longitudinal direction and on the exposed substrate portion in a lateral direction, in order to form regions without feedthrough dislocations. The materials of the substrate, the buffer layer, and the composition ratio of the group III nitride compound semiconductor can be combined in different ways in accordance with different conditions for epitaxial growth. Accordingly, when sapphire and aluminum nitride (AlN) are used to form the substrate and the buffer layer, respectively, a group III nitride compound semiconductor represented by a general formula $Al_xGa_yIn_{1-x-y}N$ ($0 \leq x \leq 1$, $0 \leq y \leq 1$, $0 \leq x+y \leq 1$, except AlN, when x=1 and y=0) and having an arbitrary composition ratio may be used to form the group III nitride compound semiconductor.

In the above embodiments, sapphire is used to form the substrate 1. Alternatively, silicon (Si), silicon carbide (SiC), and other materials can be used.

In the embodiments, aluminum nitride (AlN) is used to form the buffer layer 2. Alternatively, gallium nitride (GaN), gallium indium nitride ($Ga_xIn_{1-x}N$, $0<x<1$), aluminum gallium nitride ($Al_xGa_{1-x}N$, $0<x<1$) or aluminum gallium indium nitride ($Al_xGa_yIn_{1-x-y}N$, $0<x<1$, $0<y<1$, $0<x+y<1$) may also be used.

Figure 5:
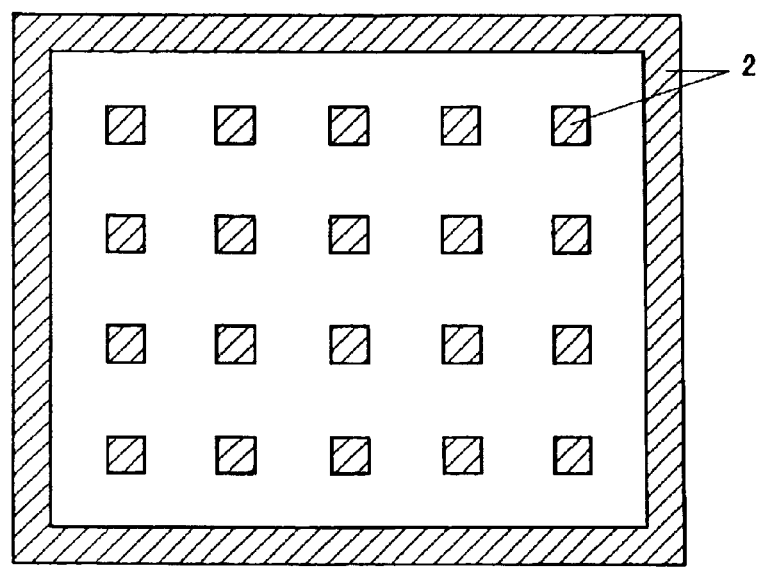
FIG. 5 is a view of a buffer layer according to other embodiments of the present invention.
Figure 6:
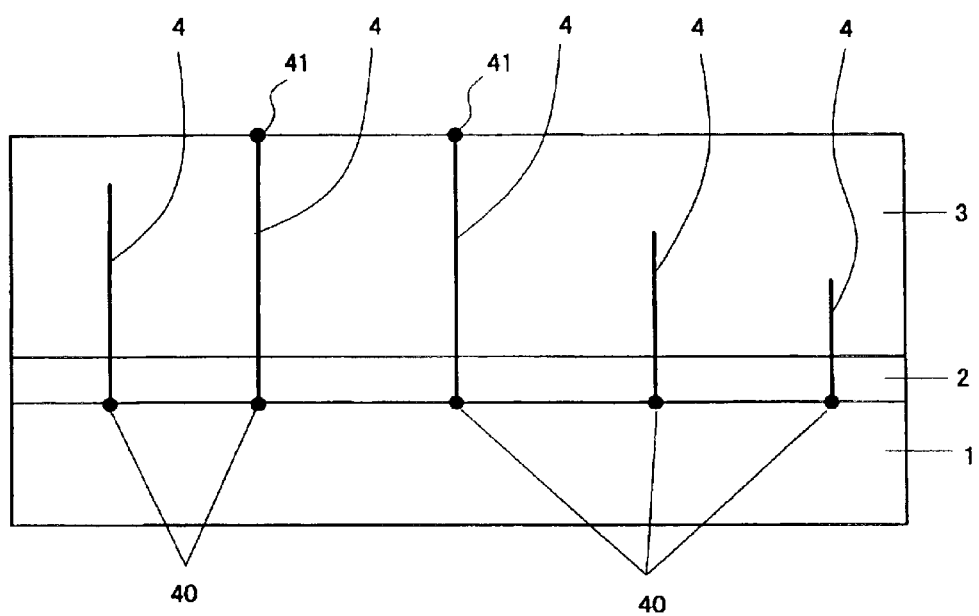
FIG. 6 is a sectional view showing a group III nitride compound semiconductor formed by a conventional method.

In the embodiments, the buffer layer 2 is formed in a striped pattern. Alternatively, the buffer layer 2 can be formed into an island pattern by exposing the substrate 1 in a grid pattern as shown in FIG. 5. Although the buffer layer 2 surrounds the peripheral surface of the substrate in FIG. 5, it is not necessarily present.

As described above, a group III nitride compound semiconductor substrate can be obtained. Except when selectivity of epitaxial growth is prevented, an arbitrary dopant such as silicon (Si), germanium (Ge), zinc (Zn), indium (In), or magnesium (Mg) may be doped into the group III nitride compound semiconductor substrate. Accordingly, the group III nitride compound semiconductor substrate which has an arbitrary resistivity and includes an arbitrary dopant may be obtained.

A light-emitting diode or a laser device comprising various group III nitride compound semiconductors, which is well known to have a double hetero structure comprising a guide layer, a cladding layer, an active layer having an MQW or SQW structure can be formed in the group III nitride compound semiconductor substrate of the present invention. For example, when a laser diode is formed on the group III nitride compound semiconductor substrate, a resonator facet can be easily cleaved because all the layers from the substrate to other layers are made of group III nitride compound semiconductors. As a result, oscillation efficiency of the laser can be improved. And by forming the group III nitride compound semiconductor substrate to have conductivity, electric current can flow in a vertical direction to the surface of the substrate. As a result, a process for forming an electrode can be simplified and the sectional area of the current path becomes wider and the length becomes shorter, resulting in lowering a driving voltage of the device.

In the above embodiments, the MOVPE method is carried out under normal pressure. Alternatively, the MOVPE method can be carried out under reduced pressure. Further alternatively, it can be carried out under conditions combining normal pressure and reduced pressure. The group III nitride compound semiconductor of the present invention can be applied not only to a light-emitting device such as an LED or an LD but also to a light-receiving device or an electronic device.

While the invention has been described in connection with what are presently considered to be the most practical and preferred embodiments, it is to be understood that the invention is not to be limited to the disclosed embodiments, but on the contrary, is intended to cover various modifications and equivalent arrangements included within the spirit and scope of the appended claims.

What is claimed is:

1. A method for manufacturing a group III nitride compound semiconductor, which hardly grows epitaxially on a substrate by crystal growth, comprising:

forming a buffer layer on said substrate into an island pattern such as a dot pattern, a striped pattern, or a grid pattern such that substrate-exposed portions are formed in a scattered manner;

forming a group III nitride compound semiconductor layer on said island patterned buffer layer by growing said group III nitride compound epitaxially in longitudinal and lateral directions; and decreasing surface density of longitudinal feedthrough dislocations of said group III nitride compound semiconductor over said substrate-exposed portion, wherein an area of the island pattern is less than an area of the substrate-exposed portions.

2. A method for manufacturing a group III nitride compound semiconductor, which hardly grows epitaxially on a substrate by crystal growth, comprising:

forming a buffer layer on said substrate into an island pattern such as a dot pattern, a striped pattern, or a grid pattern such that substrate-exposed portions are formed in a scattered manner;

forming a group III nitride compound semiconductor layer on said island patterned buffer layer by growing said group III nitride compound epitaxially in longitudinal and lateral directions;

etching at least one region of said group III nitride compound semiconductor layer, growing in a longitudinal direction on said island patterned buffer layer; and growing said group III nitride compound semiconductor epitaxially in a lateral direction on a remaining unetched portion of the group III nitride compound semiconductor.

3. A method for manufacturing a group III nitride compound semiconductor according to claim 1, further comprising:

combining epitaxial growth of said group III nitride compound formed on said island patterned buffer layer in a longitudinal direction and epitaxial growth of said group III nitride compound in a lateral direction by using the difference between the velocities of epitaxial growth of said group III nitride compound semiconductor layer on said buffer layer and on said substrate, in order to obtain a group III nitride compound semiconductor layer which covers the surface of said substrate.

4. A method for manufacturing a group III nitride compound semiconductor according to claim 2 further comprising:

combining epitaxial growth of said group III nitride compound formed on said island patterned buffer layer in a longitudinal direction and epitaxial growth of said group III nitride compound in lateral direction by using the difference between the velocities of epitaxial growth of said group III nitride compound semiconductor layer on said buffer layer and on said substrate, in order to obtain a group III nitride compound semiconductor layer which covers the surface of said substrate.

5. A method for manufacturing a group III nitride compound semiconductor according to claim 1, wherein said substrate is made of sapphire.

6. A method for manufacturing a group III nitride compound semiconductor according to claim 2, wherein said substrate is made of sapphire.

7. A method for manufacturing a group III nitride compound semiconductor according to claim 1, wherein said buffer layer is made of aluminum nitride (AlN).

8. A method for manufacturing a group III nitride compound semiconductor according to claim 2, wherein said buffer layer is made of aluminum nitride (AlN).

9. A method for manufacturing a group III nitride compound semiconductor according to claim 1, wherein said group III nitride compound semiconductor growing in a lateral direction does not comprise aluminum (Al).

10. A method for manufacturing a group III nitride compound semiconductor according to claim 2, wherein said group III nitride compound semiconductor growing in a lateral direction does not comprise aluminum (Al).

11. A method for manufacturing a group III nitride compound semiconductor according to claim 1, further comprising:

forming an another group III nitride compound semiconductor layer on said group III nitride compound semiconductor in order to obtain a light-emitting group III nitride compound semiconductor device, wherein said group III nitride compound semiconductor is formed on a region where said island patterned buffer layer is not formed.

12. A method for manufacturing a group III nitride compound semiconductor according to claim 2, further comprising:

forming an another group III nitride compound semiconductor layer on said group III nitride compound semiconductor in order to obtain a light-emitting group III nitride compound semiconductor device, wherein said group III nitride compound semiconductor is formed on a region where said island patterned buffer layer is not formed.

13. A method for manufacturing a group III nitride compound semiconductor according to claim 1, further comprising:

removing said substrate in order to obtain only said group III nitride compound semiconductor layer.

14. A method for manufacturing a group III nitride compound semiconductor according to claim 2, further comprising:

removing said substrate in order to obtain only said group III nitride compound semiconductor layer.

15. A light-emitting group III nitride compound semiconductor device formed by the method of claim 11.

16. A light-emitting group III nitride compound semiconductor device formed by the method of claim 12.

17. A group III nitride compound semiconductor substrate formed by the method of claim 13.

18. A group III nitride compound semiconductor substrate formed by the method of claim 14.

* * * * *